(12) United States Patent
Goto (10) Patent No.: US 7,679,333 B2
(45) Date of Patent: Mar. 16, 2010

(54) DELAY TIME GENERATION CIRCUIT, SEMICONDUCTOR DEVICE FOR PROTECTING SECONDARY BATTERIES USING DELAY TIME GENERATION CIRCUIT, BATTERY PACK, AND ELECTRONIC DEVICE

(75) Inventor: Tomoyuki Goto, Kanagawa (JP)

(73) Assignee: Ricoh Company, Ltd, Tokyo (JP)

( * ) Notice: Subject to any disclaimer, the term of this patent is extended or adjusted under 35 U.S.C. 154(b) by 148 days.

(21) Appl. No.: 11/900,317

(22) Filed: Sep. 10, 2007

(65) Prior Publication Data

US 2008/0061743 A1 Mar. 13, 2008

(30) Foreign Application Priority Data

Sep. 11, 2006 (JP) ............................ 2006-245021

(51) Int. Cl.
*H02J 7/00* (2006.01)
(52) U.S. Cl. ...................................... 320/134; 327/261
(58) Field of Classification Search ................. 320/134; 361/83, 89, 91.3, 94; 327/261

See application file for complete search history.

(56) References Cited

U.S. PATENT DOCUMENTS 4,726,045 A 2/1988 Caspell et al.

FOREIGN PATENT DOCUMENTS

| JP | 2005-12852 | 1/2005 |
|---|---|---|
| KR | 293776 | 6/2001 |

OTHER PUBLICATIONS

Machine Translation for JP2005-012852.*
Jan. 22, 2009 official action (and English translation thereof) in connection with a counterpart Korean patent application No. 10-2007-0092082.

* cited by examiner

*Primary Examiner*—Edward Tso
*Assistant Examiner*—Ramy Ramadan
(74) *Attorney, Agent, or Firm*—Cooper & Dunham, LLP (57) ABSTRACT

A delay time generation circuit is disclosed that includes a counter circuit composed of plural cascade-connected flip-flop circuits for counting a pulse number of an input clock signal and uses as a delay time signal an inverse signal of an output of the last stage or a predetermined stage of the flip-flop circuits of the counter circuit. In the delay time generation circuit, a delay time is generated by the use of an output signal of one of the flip-flop circuits precedent to the last stage or the predetermined stage flip-flop circuit of the counter circuit at testing an electronic circuit. This configuration makes it possible to reduce the delay time without using a special high-speed clock.

13 Claims, 6 Drawing Sheets

DELAY TIME GENERATION CIRCUIT, SEMICONDUCTOR DEVICE FOR PROTECTING SECONDARY BATTERIES USING DELAY TIME GENERATION CIRCUIT, BATTERY PACK, AND ELECTRONIC DEVICE

BACKGROUND

1. Technical Field

This disclosure relates to a technology of a delay time generation circuit for use in delaying a signal of an electronic circuit and, in particular, to a delay time generation circuit capable of reducing a delay time at testing an electronic circuit, a semiconductor device for protecting secondary batteries using the delay time generation circuit, a battery pack, and an electronic device.

2. Description of the Related Art

Easy-to-use battery packs have widely been used as power sources for various portable electronic devices. The battery packs are formed into a package storing one or plural secondary batteries, and high capacity ones such as lithium-ion batteries, lithium polymer batteries, and nickel hydride batteries are used as the secondary batteries. As the high capacity secondary batteries hold an extremely large amount of energy, they generate heat at high temperature and may sometimes cause ignition in cases of an overcharge, an overdischarge, and an overcurrent.

Therefore, a semiconductor device for protecting the secondary batteries from an overcharge, an overdischarge, a charge overcurrent, a discharging overcurrent, and a short-circuit current is installed in the battery pack. When it is necessary to protect the secondary batteries, the semiconductor device for protecting the secondary batteries interrupts a connection between the secondary batteries and a charger or between the secondary batteries and a load device to prevent the generation of heat and the ignition.

The semiconductor device for protecting the secondary batteries has a dedicated detection circuit to detect each of an overcharge, an overdischarge, a charge overcurrent, a discharge overcurrent, and a short-circuit current. Upon detection of an abnormality requiring a protecting operation, the detection circuit outputs an abnormality detection signal and turns off a switch provided between the secondary batteries and the charger (at charging) or between the secondary batteries and the load device (at discharging) to interrupt the connection.

If the switch is turned off immediately after the output of the abnormality detection signal, the power supply to the load device is caused to stop even where the detection signal is output only for a short period of time, for example, by a malfunction due to noise, thereby leading to a problem such as an improper operation of the load device. In order to prevent such an improper operation, the semiconductor device for protecting the secondary batteries is designed in such a manner as to determine as a true abnormality only an abnormality that still continues after a predetermined time has elapsed since the output of the abnormality detection signal, and then to turn off the switch.

The predetermined time is called a delay time. The delay time is different (from several tens of milliseconds to a few seconds) depending on the detected abnormality. In other words, the delay time is set short for a case where the degree of abnormality is large or an urgent case, whereas it is set long for a case where the degree of abnormality is small or a non-urgent case.

For example, the delay times at detecting an overdischarge, an overcurrent, and a short circuit are about 16 ms, 10 ms, and 1 ms, respectively. However, the delay time at detecting an overcharge with an overcharge detection circuit is 1 s or more and may sometimes be about 5 s at a maximum.

If the delay time is waited for in conducting a characteristic inspection, a shipping inspection, or the like for the semiconductor device for protecting the secondary batteries, it will take too much time, thereby causing reduced productivity and increased costs.

The invention disclosed in JP-A-2005-12852 (Patent Document 1) has been made by the present applicant to solve the above problems. According to this invention, the frequency of a clock signal to be supplied to a delay time generation circuit using a frequency counter is increased at testing a semiconductor device to thereby reduce the delay time.

Figure 1:
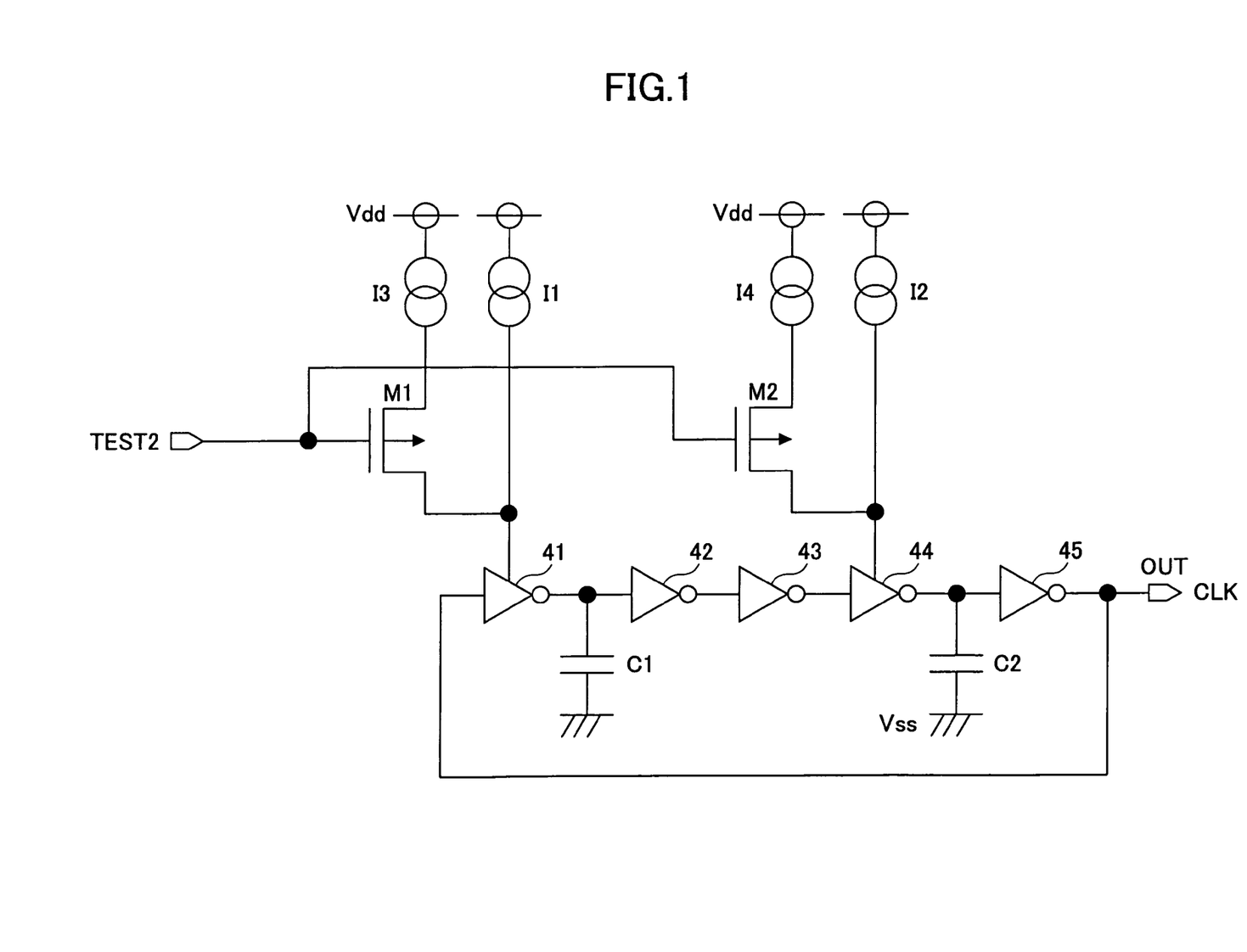
FIG. 1 is a block diagram of a clock signal generation circuit used in a related art case.

FIG. 1 is a block diagram of the clock signal generation circuit disclosed in the Official Gazette. The circuit is a ring oscillation circuit using inverters 41 through 45. The setting of an oscillation frequency of the ring oscillation circuit makes use of time required for charging and discharging capacitors C1 and C2 with the output of constant current inverters 41 and 44. The oscillation frequency of the ring oscillation circuit can be increased by substantially increasing the constant current value of constant current sources constituting the constant current inverters 41 and 44. Referring to FIG. 1, a description is specifically made below.

In a normal operation, a test signal TEST2 is set to a high level, and PMOS transistors M1 and M2 are turned off. Therefore, since the currents of current sources I3 and I4 are not supplied to the constant current inverters 41 and 44, respectively, the charging and discharging of the capacitors C1 and C2 are performed only by constant current sources I1 and I2, respectively, thereby resulting in long charging and discharging times and a low oscillation frequency.

At the test, the test signal TEST2 is set to a low level, and both of the PMOS transistors M1 and M2 are turned on. Then, since the currents of the current sources I3 and I4 are supplied to the constant current inverters 41 and 44, the charging and discharging of the capacitor C1 and that of the capacitor C2 are performed by the sum current of the current sources I1 and I3 and that of the current sources I2 and I4, respectively, thereby resulting in short charging and discharging times and a high oscillation frequency.

Patent Document 1: JP-A-2005-12852

However, conventional oscillation circuits cannot accurately set the frequency of a clock signal. This is because the current values of the current sources I1 through I4 and the electrostatic capacitances of the capacitors C1 and C2 fluctuate due to the manufacturing tolerance.

In addition, the manufacturing tolerance is found also in the current ratio of the current source I1 to the current source I3 and that of the current source I2 to the current source I4. The more the current ratio is increased, the larger an error in the current ratio becomes. As a result, it is not possible to accurately set the ratio of a low-speed clock frequency in the normal operation to a high-speed clock frequency at the test, and the test time is caused to greatly fluctuate for the semiconductor devices at the test using a high-speed clock.

Moreover, since the ratio of a low-speed clock to a high-speed clock fluctuates, the delay time itself cannot be measured by the high-speed clock.

Besides, the frequency itself of a high-speed clock cannot be greatly increased. This is because, in a case where the frequency of a high-speed clock is increased, there is a need to use an element for a semiconductor device, which operates at high speed. Furthermore, it is necessary to increase the current value of the current sources I3 and I4 for achieving high speed, but an increase in the current value requires a large circuit area for the current source, thereby causing increased size and increased costs for an IC chip.

On the other hand, it will take time to perform the test if the speed of a clock at the test cannot be increased, thereby causing increased inspection costs. Therefore, it is necessary to determine the frequency of the test in consideration of both costs.

SUMMARY

In an aspect of this disclosure, there are provided a delay time generation circuit capable of greatly reducing a test time without using a high-speed clock and of preventing an increase in an area of an IC chip, a semiconductor device for protecting secondary batteries using the delay time generation circuit, a battery pack, and an electronic device.

In another aspect of this disclosure, there is provided a delay time generation circuit that includes a counter circuit composed of plural cascade-connected flip-flop circuits for counting a pulse number of an input clock signal and uses as a delay time signal an inverse signal of an output of the last stage or a predetermined stage of the flip-flop circuits of the counter circuit. In the delay time generation circuit, a delay time is generated by the use of an output signal of one of the flip-flop circuits preceding the last stage or the predetermined stage flip-flop circuit of the counter circuit at testing an electronic circuit. This configuration makes it possible to reduce a delay time without using a high-speed clock.

The delay time can be generated by the use of an output signal of a first stage of the flip-flop circuits constituting the counter circuit. This configuration makes it possible to greatly reduce a delay time. In addition, it is also possible to obtain a delay time in a normal mode by measuring the delay time.

In another aspect of this disclosure, there is provided a semiconductor device for protecting a secondary battery that includes the above-mentioned delay time generation circuit so that an overcharge, an overdischarge, or an overcurrent of the secondary battery is detected to protect the secondary battery from the overcharge, the overdischarge, or the overcurrent. In the semiconductor device for protecting a secondary battery, a detection signal at the detection of the overcharge, the overdischarge, or the overcurrent is delayed for a predetermined time with the delay time generation circuit.

The semiconductor device for protecting a secondary battery can further comprise a unit for increasing a frequency of the clock signal. In the semiconductor device for protecting a secondary battery, the clock signal with its frequency increased is used in performing a test of the counter circuit. This configuration makes it also possible to perform a test of a delay circuit itself in a short period of time.

The unit for increasing the frequency of the clock signal is used as a unit for substantially increasing a constant current value of a constant current source constituting the constant current inverter so as to increase an oscillation frequency of a ring oscillation circuit in which plural delay elements composed of a constant current inverter and a capacitor are connected in a closed loop and which generates the clock signal, in the above-mentioned semiconductor device for protecting a secondary battery.

The unit for substantially increasing the constant current value is used as a unit for enabling another constant current source provided in parallel with the constant current source, in the above-mentioned semiconductor device for protecting a secondary battery.

In another aspect of this disclosure, there are provided a battery pack that includes the above-mentioned semiconductor device for protecting a secondary battery and an electronic device that uses the above-mentioned battery pack.

Since only the first stage or the preceding stage flip-flop circuit constituting the counter circuit for generating a delay time is used to generate a delay time, it is possible to achieve the delay time generation circuit capable of reducing a delay time without using a high-speed clock.

Further, it is also possible to obtain a delay time in the normal mode by measuring a delay time in the test mode.

In addition, it is possible to achieve the semiconductor device for protecting a secondary battery capable of reducing a delay time of an abnormality detection signal of an overcharge, an overdischarge, or an overcurrent without using a high-speed clock.

Moreover, it is possible to perform a test of the delay time generation circuit in a short period of time by the use of a conventional high-speed clock.

Further, it is possible to achieve a convenient and useful battery pack and electronic device by the use of the above semiconductor device for protecting a secondary battery capable of performing a test in a short period of time.

DETAILED DESCRIPTION OF THE PREFERRED EMBODIMENTS

Next, referring to the accompanying drawings, a description is specifically made of embodiments of the present invention.

Figure 2:
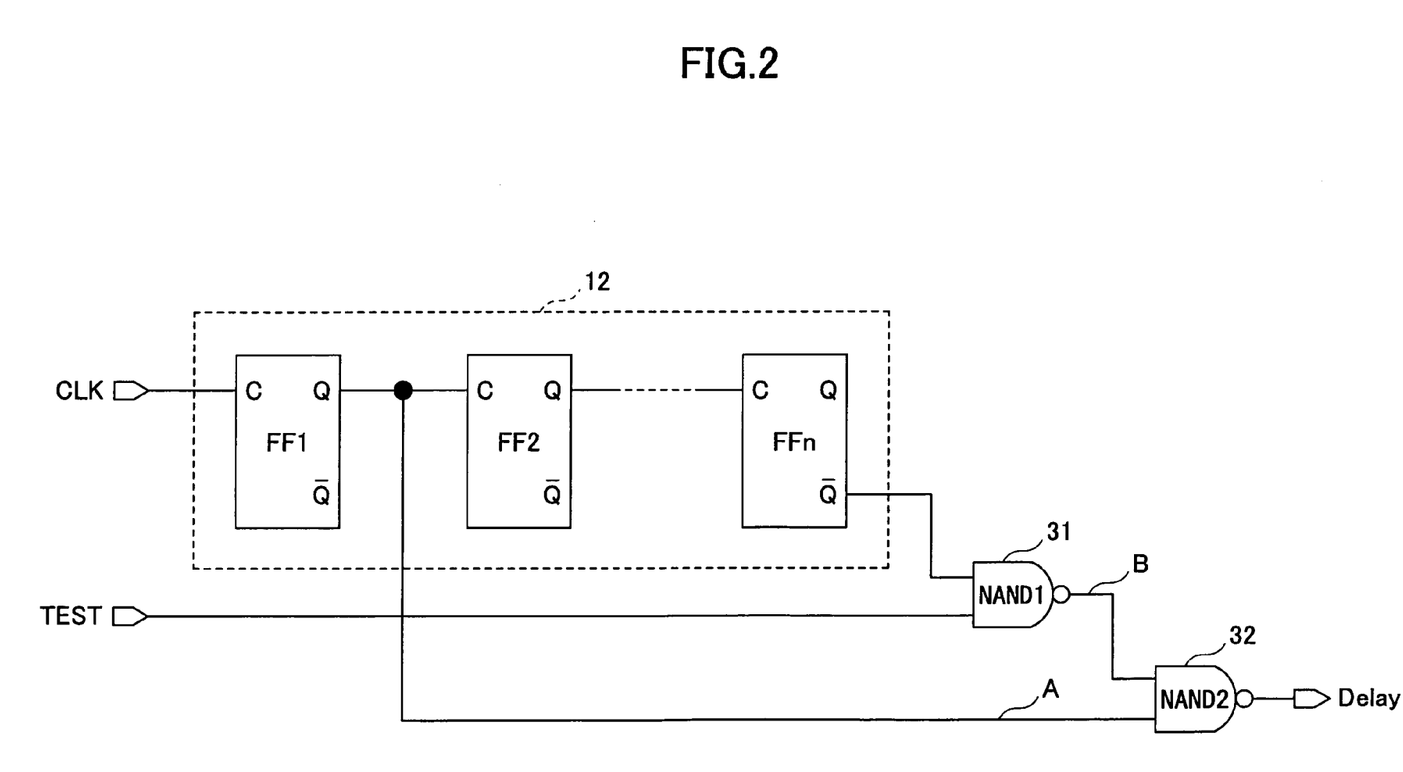
FIG. 2 is a circuit diagram of a delay time generation circuit showing a first embodiment of the present invention.

FIG. 2 is a circuit diagram of a delay time generation circuit showing a first embodiment of the present invention. The delay time generation circuit is composed of a counter circuit 12 constituted of plural flip-flop circuits FF1 through FFn and two NAND circuits 31 and 32 and includes an input for a clock signal CLK, an input for a test signal TEST, and an output for a delay signal Delay.

The clock signal CLK is input to the input terminal C of the first stage flip-flop circuit FF1 constituting the counter circuit 12. Furthermore, the inverse of an output Q (the inverse signal of the output Q) of the last stage flip-flop circuit FFn is connected to the input 1 of the NAND circuit 31. The number of the flip-flop circuits constituting the counter circuit 12 is not limited and is determined based on the frequency of a clock signal and a required delay time.

The test signal TEST is connected to the input 2 of the NAND circuit 31. A signal B as an output of the NAND circuit 31 is connected to the input 1 of the NAND circuit 32. The output Q of the first stage flip-flop circuit FF1 is connected to the input 2 of the NAND circuit 32 as a signal A.

Figure 3A:
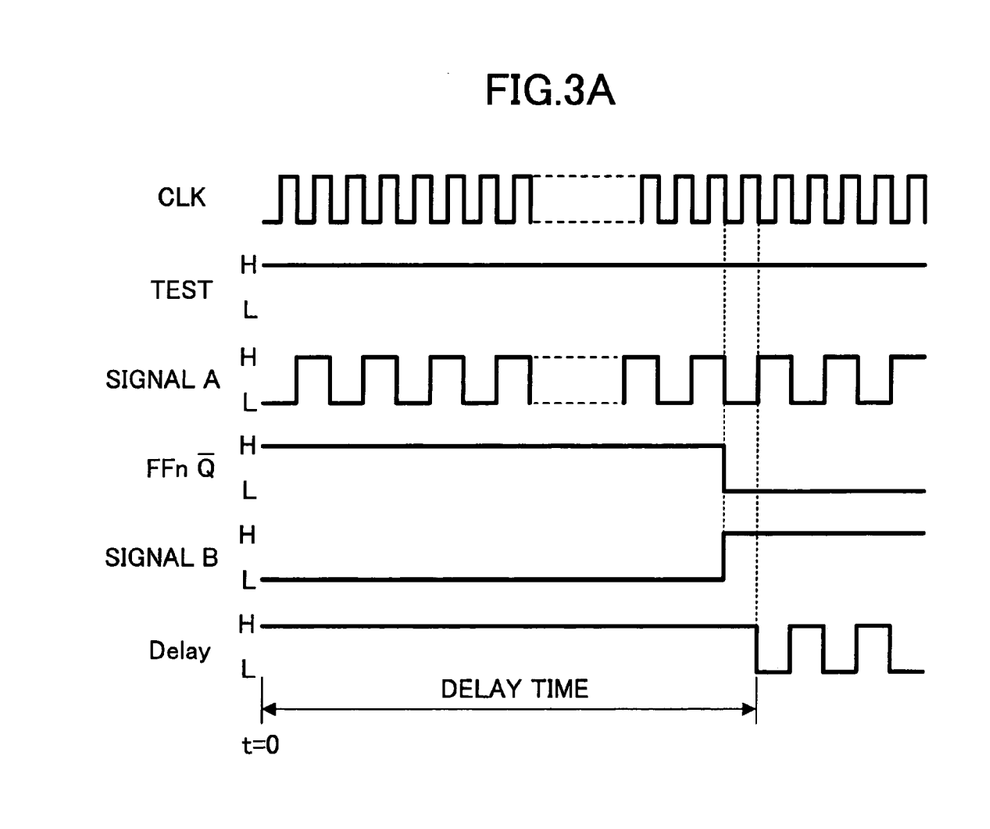
FIGS. 3A and 3B are timing charts of the circuit of FIG. 2.
Figure 3B:
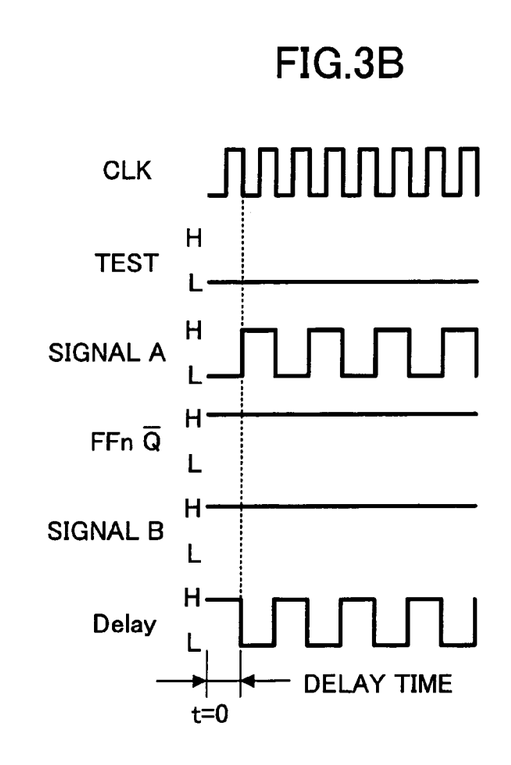

FIGS. 3A and 3B are timing charts of the circuit of FIG. 2. Referring to the timing charts, a description is made of the operations of the circuit below. Note that FIGS. 3A and 3B show operations in a normal operation and those in a test mode, respectively.

The descriptions of "CLK," "TEST," "signal A," "inverse of Q of FFn," "signal B," and "Delay" represent a clock signal, a test signal, an output Q of the first stage flip-flop circuit FF1 (the input 2 of the NAND circuit 32), an inverse of an output Q of the last stage flip-flop circuit FFn (the input 1 of the NAND circuit 31), an output of the NAND circuit 31 (the input 1 of the NAND circuit 32), and a delay time as an output of the delay time generation circuit of the present embodiment, respectively.

First, the test signal TEST is set to a high level in the normal operation of FIG. 3A. Since the signal A is the output Q of the first stage flip-flop circuit FF1, it becomes a clock signal obtained by dividing the frequency of the clock signal CLK into halves.

Since all of the inverse of the output Q of the flip-flop circuits FF1 through FFn constituting the counter circuit 12 are set to a high level in a state where the counter circuit 12 is reset, the inverse of Q of FFn is set to a high level at the time "t=0" at which the reset state of the counter circuit 12 is cancelled.

The signal B is a NAND signal of the test signal TEST and the inverse of Q of FFn and set to a low level since both of these signals are set to a high level at the time "t=0."

The delay signal Delay is a NAND signal of the signals A and B and set to a high level since the signal B is set to a low level at the time "t=0."

When the inverse of the output Q of the last stage flip-flop circuit FFn is set to a low level as the counting with the counter circuit 12 advances, the signal B is set to a high level. At this time, the delay signal Delay is not changed since the signal A is still set to a low level.

When the signal A is set to a high level as the counting with the counter circuit 12 further advances, the delay signal Delay is changed to a low level. This change of the delay signal Delay represents a delay time end signal. In other words, the time between the time "t=0" at which the reset of the counter circuit 12 is cancelled and the time at which the delay time Delay is changed to a low level is defined as a delay time.

Next, a description is made of a case in the test mode shown in FIG. 3B. The test signal TEST in the test mode is set to a low level. When the test signal TEST is set to a low level, the signal B is set to a high level regardless of the inverse of the output Q of the last stage flip-flop circuit FFn.

At the time "t=0," the reset of the counter circuit 12 is cancelled, and the counting of the clock signal CLK is started. Since the signal B is applied to the input 1 of the NAND circuit 32, the delay signal Delay is changed to a low level when the output Q of the first stage flip-flop circuit FF1 connected to the input 2 is set to a high level. Therefore, as shown in the timing chart, the delay signal Delay is caused to be output in an extremely short period of time where only one pulse of the clock signal CLK is counted, thereby reducing the test time.

In addition, since the frequency of the clock signal CLK is obtained by measuring the delay time in the test mode, it is also possible to measure the length of the delay time in the normal operation.

In the above embodiment, the delay time end signal in the normal operation is obtained from the last stage flip-flop circuit FFn, but this is the case for generating the longest delay time. When it is necessary to obtain a shorter delay time, the output of one of the flip-flop circuits precedent to the last stage flip-flop circuit may be used as the delay time end signal. It can easily be achieved by providing a switch for switching the output of the plural flip-flop circuits and switching the output of the flip-flop circuit to be input to the input 1 of the NAND circuit 31 as needed.

Furthermore, the delay time end signal in the test mode is obtained from the first stage flip-flop circuit FF1, but it is not limited to the first stage flip-flop circuit. Alternatively, it may be obtained either from the second or the third stage flip-flop circuit. The delay time most suitable for a test may be selected.

Figure 4:
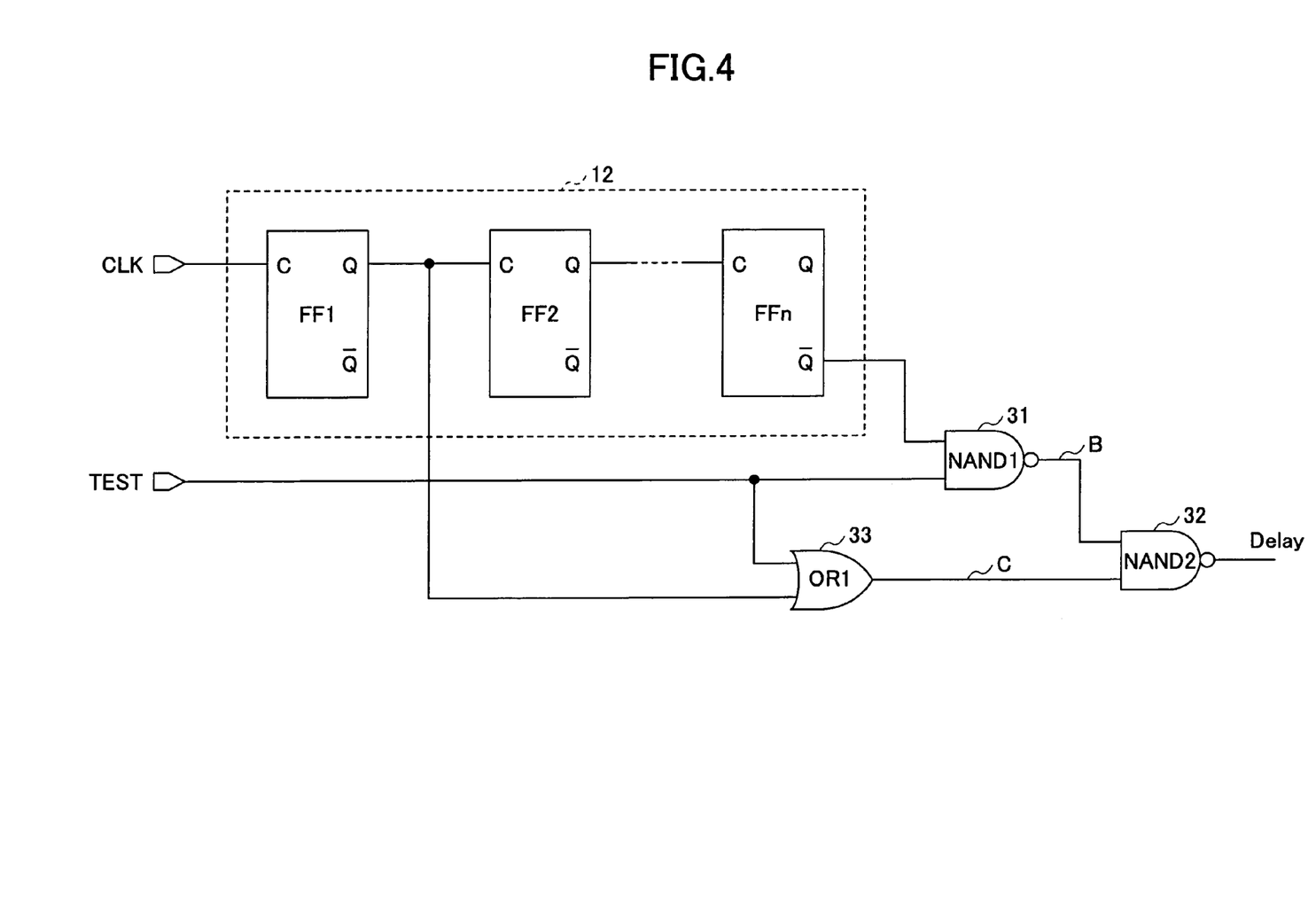
FIG. 4 is a circuit diagram of the delay time generation circuit showing a second embodiment of the present invention.

FIG. 4 is a circuit diagram of the delay time generation circuit showing a second embodiment of the present invention. FIG. 4 is different from FIG. 2 in that an OR circuit 33 is added between the output Q of the first stage flip-flop circuit FF1 and the input 2 of the NAND circuit 32. The test signal TEST is connected to the input 1 of the OR circuit 33.

Figure 5A:
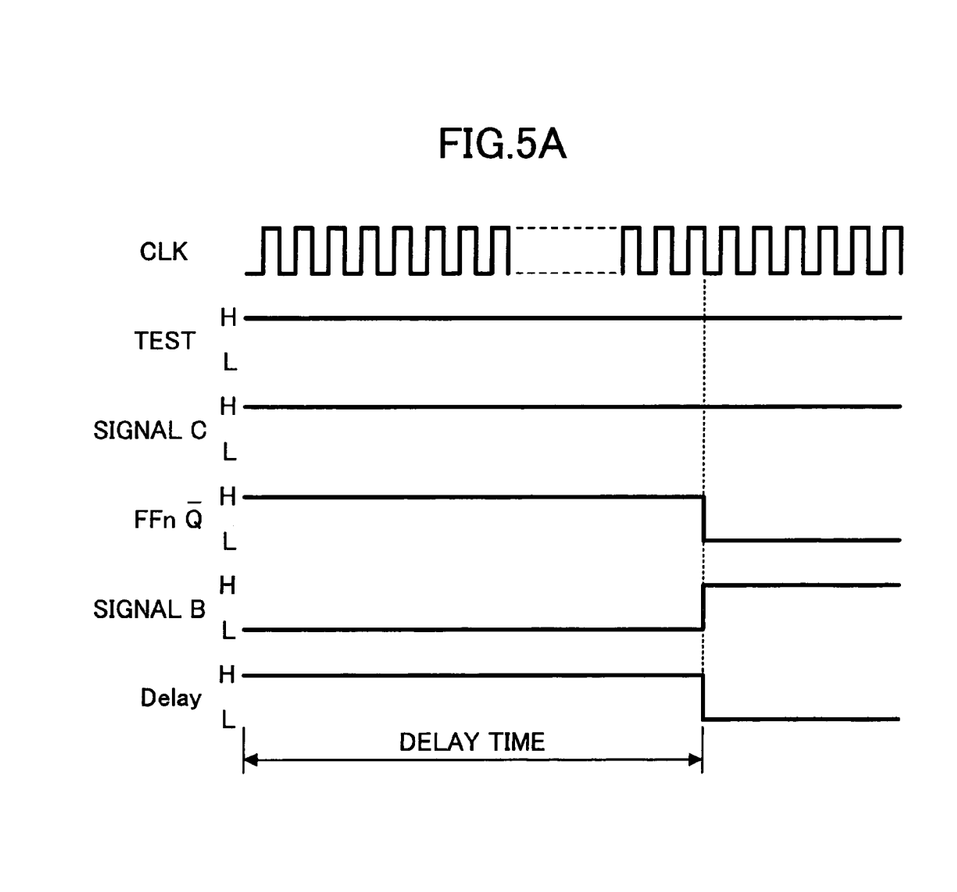
FIGS. 5A and 5B are timing charts of the circuit of FIG. 4.
Figure 5B:
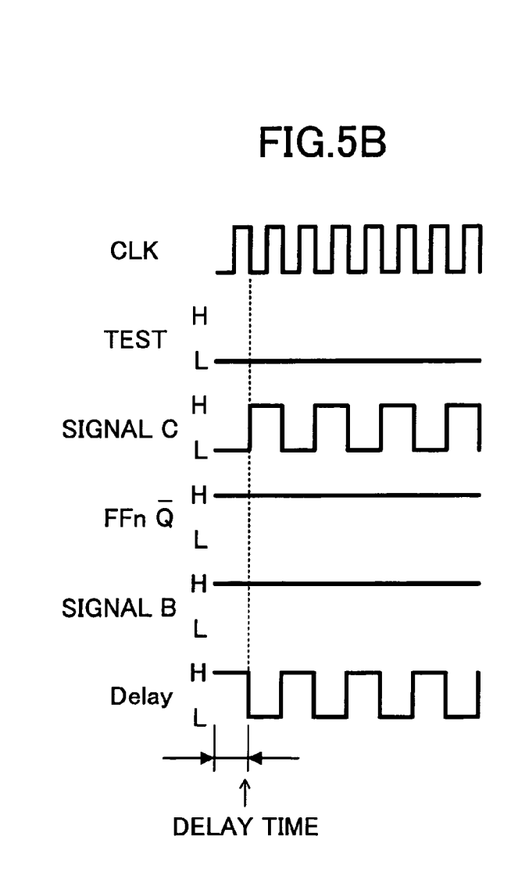

FIGS. 5A and 5B are timing charts of the circuit of FIG. 4. Referring to the timing charts, a description is made of the operations of the circuit below. Note that FIGS. 5A and 5B show operations in the normal operation and those in the test mode, respectively. Furthermore, the signal names are the same as those in the timing charts of FIGS. 3A and 3B.

First, the test signal TEST is set to a high level in the normal operation of FIG. 5A. Since the signal is applied to the input 1 of the OR circuit 33, a signal C as an output of the OR circuit 33 is set to a high level.

The operations of the inverse of Q of FFn and the signal B are the same as those of FIGS. 3A and 3B. When the inverse of the output Q of the last stage flip-flop circuit FFn is set to a low level as the counting with the counter circuit 12 advances, the signal B is set to a high level. Since the signal C has been set to a high level, the delay signal Delay is changed to a low level immediately after the signal B is set to a high level. This change of the delay signal-Delay represents a delay time end signal. In other words, the time between the time "t=0" at which the reset of the counter circuit 12 is cancelled and the time at which the delay time Delay is changed to a low level is defined as a delay time.

Next, a description is made of a case in the test mode shown in FIG. 5B. The test signal TEST in the test mode is set to a low level. Since the output Q of the first stage flip-flop circuit FF1 input to the input 1 of the OR circuit 33 is caused to appear in the output of the OR circuit 33 as it is when the low-level test signal TEST is input to the input 2 of the OR circuit 33, the operations will be the same as those of the circuit of FIG. 2.

In other words, the signal B is set to a high level regardless of the inverse of the output Q of the last stage flip-flop circuit FFn. Therefore, the reset of the counter circuit 12 is cancelled at the time "t=0" to start the counting of the clock signal CLK. When the output Q of the first stage flip-flop circuit FF1 is set to a high level, the delay signal Delay is changed to a low level.

Although the delay time in the normal operation is shorter than that of the first embodiment for one period in this circuit, it is a negligible error since the time of one period of a clock signal is extremely short compared with the delay time.

Furthermore, the delay time end signal is obtained from the output Q of the first stage flip-flop circuit FF1 in this embodiment, but it is not limited to the first stage flip-flop circuit as in the first embodiment. It may be the second or the third stage flip-flop circuit so long as it is precedent to the last stage flip-flop circuit. Note, however, that the nearer to the last stage flip-flop circuit it is, the longer a delay time in the test mode will become.

Figure 6:
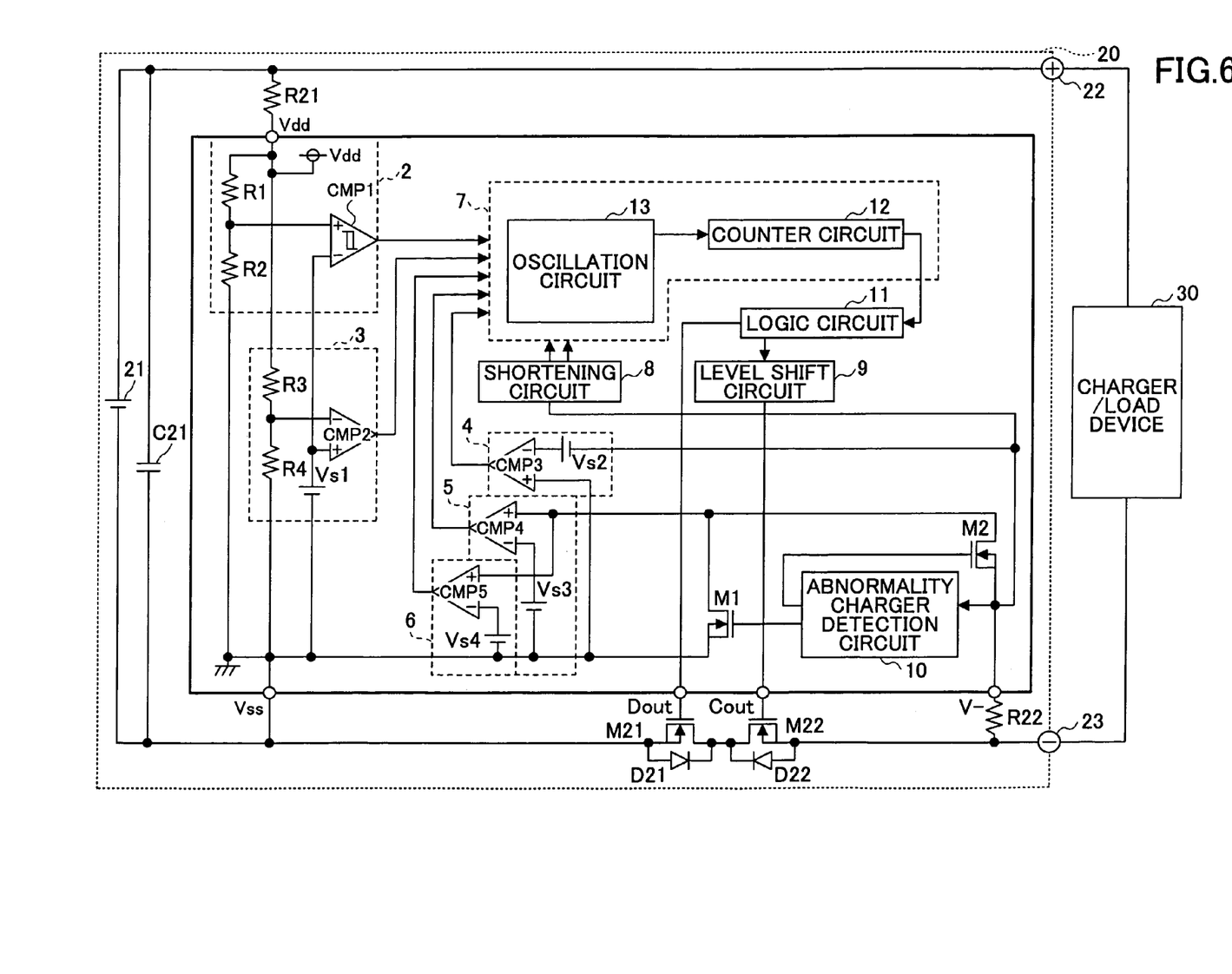
FIG. 6 is a circuit diagram of a battery pack including a semiconductor device for protecting secondary batteries using the delay time generation circuit according to the embodiments of the present invention.

FIG. 6 is a circuit diagram of a battery pack including a semiconductor device for protecting-secondary batteries using the delay time generation circuit according to the embodiments of the present invention.

The semiconductor device 1 for protecting secondary batteries is composed of an overcharge detection circuit 2, an overdischarge detection circuit 3, a charge overcurrent detection circuit 4, a first discharge overcurrent detection circuit 5, a second discharge overcurrent detection circuit 6, a delay time generation circuit 7, a shortening circuit 8, a level shift circuit 9, an abnormality charger detection circuit 10, a logic circuit 11, and NMOS transistors M1 and M2. The semiconductor device 1 for protecting secondary batteries includes a discharge control terminal Dout for controlling a discharge control NMOS transistor M21, a charge control terminal Cout for controlling a charge control NMOS transistor M22, and a current detection terminal V— for detecting a charge/discharge current after converting it into a voltage.

The output signals (detection signals) of the overcharge detection circuit 2, the overdischarge detection circuit 3, the discharge overcurrent detection circuit 4, the first discharge overcurrent detection circuit 5, and the second discharge overcurrent detection circuit 6 are input to the delay time generation circuit 7. After being delayed for a predetermined delay time with the delay time generation circuit 7 and output to the logic circuit 11, the output signal controls the discharge control NMOS transistor M21 and the charge control NMOS transistor M22. Note that the delay time is not uniform: it varies depending on detection contents. Furthermore, the test signal TEST is output from the shortening circuit 8.

According to the test method of the embodiments of the present invention, it is possible to confirm only the operations of the flip-flop circuit (of the first stage in the embodiments) that outputs the delay time end signal, from among the flip-flop circuits constituting the counter circuit at the test. Therefore, it is necessary to confirm the operations of all the flip-flop circuits at least once in the test mode.

Accordingly, the circuit of FIG. 1 described in the paragraph "Description of the Related Art" is used for the oscillation circuit generating the clock signal CLK used in the delay time generation circuit of the embodiments of the present invention. When a test signal TEST 2 different from the test signal TEST is set to a low level, the frequency of the clock signal CLK is increased to cause all the flip-flop circuits constituting the counter circuit 12 to operate and generate the delay time by the inverse of the output Q of the last stage flip-flop circuit FFn. In the case of this test, the test signal TEST, is of course, set to a high level.

Needless to say, applied technologies of the delay time generation circuit, the semiconductor device for protecting secondary batteries, and the battery pack like the above embodiments are applicable not only to acoustic equipment recently in widespread use such as mobile phones, digital cameras, portable MD (Mini Disc) devices, but also to various electronic devices requiring secondary batteries.

The present invention is not limited to the specifically disclosed embodiments, and variations and modifications may be made without departing from the scope of the present invention.

The present application is based on Japanese Priority Patent Application No. 2006-245021, filed on Sep. 11, 2006, the entire contents of which are hereby incorporated by reference.

What is claimed is:

1. A delay time generation circuit that includes a counter circuit composed of plural cascade-connected flip-flop circuits for counting a pulse number of an input clock signal and uses as a delay time signal an inverse signal of an output of a last stage or a predetermined stage of the flip-flop circuits of the counter circuit, wherein, at testing an electronic circuit, a delay time is generated by the use of an output signal of only one of the flip-flop circuits precedent to the last stage or the predetermined stage flip-flop circuit of the counter circuit, wherein the delay time generation circuit uses as the delay time signal the inverse signal of the output of the last stage or the predetermined stage of the flip-flop circuits of the counter circuit in normal operation, and in a test mode, uses the output signal of only one of the flip-flop circuits preceding the last stage or the predetermined stage flip-flop circuit of the counter circuit, and wherein the delay time generation circuit is provided so that an overcharge, an overdischarge, or an overcurrent of a secondary battery is detected to protect the secondary battery from the overcharge, the overdischarge, or the overcurrent, and a detection signal at the detection of the overcharge, the overdischarge, or the overcurrent is delayed by the delay time generation circuit based on the delay signal.

2. The delay time generation circuit according to claim 1, wherein the delay time is generated by use of an output signal of a first stage of the flip-flop circuits constituting the counter circuit.

3. A semiconductor device for protecting a secondary battery that includes a delay time generation circuit so that an overcharge, an overdischarge, or an overcurrent of the secondary battery is detected to protect the secondary battery from the overcharge, the overdischarge, or the overcurrent, wherein the delay time generation circuit includes a counter circuit composed of plural cascade-connected flip-flop circuits for counting a pulse number of an input clock signal and uses as a delay time signal an inverse signal of an output of a last stage or a predetermined stage of the flip-flop circuits of the counter circuit, at testing of an electronic circuit, a delay time is generated by the use of an output of only one of the flip-flop circuits preceding the last stage or the predetermined stage flip-flop circuit of the counter circuit, and a detection signal at the detection of the overcharge, the overdischarge, or the overcurrent is delayed for a predetermined time with the delay time generation circuit, wherein the delay time generation circuit uses as the delay time signal the inverse signal of the output of the last stage or the predetermined stage of the flip-flop circuits of the counter circuit in normal operation, and in a test mode, uses the output signal of only one of the flip-flop circuits preceding the last stage or the predetermined stage flip-flop circuit of the counter circuit.

4. The semiconductor device according to claim 3, further comprising a unit for increasing a frequency of the clock signal, wherein the clock signal with the increased frequency is used in performing a test of the counter circuit.

5. The semiconductor device according to claim 4, wherein the unit for increasing the frequency of the clock signal is used as a unit for substantially increasing a constant current value of a constant current source constituting the constant current inverter so as to increase an oscillation frequency of a ring oscillation circuit in which plural delay elements composed of a constant current inverter and a a capacitor are connected in a closed loop and which generates the clock signal.

6. The semiconductor device according to claim 5, wherein the unit for substantially increasing the constant current value is used as a unit for enabling another constant current source provided in parallel with the constant current source.

7. A battery pack including a semiconductor device for protecting a secondary battery that includes that includes a delay time generation circuit so that an overcharge, an overdischarge, or an overcurrent of the secondary battery is detected to protect the secondary battery from the overcharge, the overdischarge, or the overcurrent, wherein the delay time generation circuit includes a counter circuit composed of plural cascade-connected flip-flop circuits for counting a pulse number of an input clock signal and uses as a delay time signal an inverse signal of an output of a last stage or a predetermined stage of the flip-flop circuits of the counter circuit, at testing of an electronic circuit, a delay time is generated by the use of an output of only one of the flip-flop circuits preceding the last stage or the predetermined stage flip-flop circuit of the counter circuit, and a detection signal at the detection of the overcharge, the overdischarge, or the overcurrent is delayed for a predetermined time with the delay time generation circuit, wherein the delay time generation circuit uses as the delay time signal the inverse signal of the output of the last stage or the predetermined stage of the flip-flop circuits of the counter circuit in normal operation, and in the test mode, uses the output signal of only one of the flip-flop circuits preceding the last stage or the predetermined stage flip-flop circuit of the counter circuit.

8. An electronic device that uses the battery pack according to claim 7.

9. The battery pack of claim 7, further comprising a unit for increasing a frequency of the clock signal, wherein the clock signal with the increased frequency is used in performing a test of the counter circuit.

10. The battery pack of claim 9, wherein the unit for increasing the frequency of the clock signal is used as a unit for substantially increasing a constant current value of a constant current source constituting the constant current inverter so as to increase an oscillation frequency of a ring oscillation circuit in which plural delay elements composed of a constant current inverter and a capacitor are connected in a closed loop and which generates the clock signal.

11. The battery pack of claim 10, wherein the unit for substantially increasing the constant current value is used as a unit for enabling another constant current source provided in parallel with the constant current source.

12. The battery pack of claim 7, wherein the delay time is generated by use of an output signal of a first stage of the flip-flop circuits constituting the counter circuit.

13. The semiconductor device of claim 3, wherein the delay time is generated by use of an output signal of a first stage of the flip-flop circuits constituting the counter circuit.

* * * * *